United States Patent [19]
Ohikata et al.

[11] Patent Number: 5,137,479
[45] Date of Patent: Aug. 11, 1992

[54] LEAD STRUCTURE FOR PACKAGING SEMICONDUCTOR CHIP

[75] Inventors: Naoharu Ohikata; Toshio Yamamoto; Tadashi Kamiyama; Masashi Konda, all of Tokyo, Japan

[73] Assignee: Nippon Steel Corporation, Tokyo, Japan

[21] Appl. No.: 669,519

[22] Filed: Mar. 14, 1991

[30] Foreign Application Priority Data

Mar. 15, 1990 [JP] Japan .................... 2-65289

[51] Int. Cl.⁵ .................. H01L 23/28; H01L 23/495
[52] U.S. Cl. .................. 439/890; 264/272.17; 361/421; 357/70; 357/72
[58] Field of Search .......... 439/55, 68, 890; 29/827, 841; 264/272.11, 272.13, 272.17, 328.9; 357/69, 70, 72; 361/404, 405, 408, 421

[56] References Cited

U.S. PATENT DOCUMENTS

| | | |
|---|---|---|
| 3,689,991 | 9/1972 | Aird . |
| 4,504,427 | 3/1985 | Moyer .................. 264/272.15 |

FOREIGN PATENT DOCUMENTS

| | | | |
|---|---|---|---|
| 57-53969 | 3/1982 | Japan | 29/827 |
| 58-127356 | 7/1983 | Japan | 29/841 |
| 59-150458 | 8/1984 | Japan | 357/70 |
| 63-107052 | 5/1988 | Japan | 357/70 |
| 63-131558 | 6/1988 | Japan | 357/70 |
| 1-150346 | 6/1989 | Japan | 357/70 |

Primary Examiner—Neil Abrams
Attorney, Agent, or Firm—Cushman, Darby & Cushman

[57] ABSTRACT

A lead structure for packaging a semiconductor chip is provided which includes a plurality of electroconductive leads. At least one lead of an adjacent pair of electroconductive leads has at least one projecting portion which projects towards the other lead of the pair so that a tortuous path is defined between the electroconductive leads. The tortuous path minimizes outflow of molten plastic between the electroconductive leads.

9 Claims, 7 Drawing Sheets

LEAD STRUCTURE FOR PACKAGING SEMICONDUCTOR CHIP

BACKGROUND OF THE INVENTION

This invention relates to a lead structure for packaging a semiconductor chip comprising a large number of electroconductive leads, applicable to a tape carrier of TAB (Tape Automated Bonding) method, for example.

TAB method is known as one of the packaging techniques in manufacturing an integrated circuit (IC). For example, it is disclosed in U.S. Pat. No. 3,689,991.

In TAB method, a tape carrier 101 is used for supporting a semiconductor chip 110 as shown in FIG. 6. The tape carrier 101 comprises a film tape 102 and a large number of electroconductive lead patterns 103 formed on the film tape 102. The tape carrier 101 is provided with sprocket holes 106. The film tape 102 has a support ring 107 which defines a device aperture 104 for the semiconductor chip 110 at its center and an outer lead aperture 105 between the support ring 107 and the major part of the film tape 102 surrounding the support ring 107. Each lead pattern 103 is generally classified into inner lead portion 108 and outer lead portion 109. The inner lead portions 108 of the lead patterns 103 are projected into the device aperture 104 of the support ring 107 while the outer lead portions 109 are extended over the outer lead aperture 105. After the semiconductor chip 110 is bonded to the inner lead portions 108 in the device aperture 104, the outer lead portions 109 are cut at their outer ends in the outer lead aperture 105. In this manner, the semiconductor chip 110 and the support ring 107 connected to each other by the inner lead portions 108 are separated together with the outer lead portions 109 from the tape carrier 101. Then, the outer lead portions 109 which project out from the support ring 107 are bent in a so-called gull wing shape and bonded to wiring patterns of a printed board or the like.

In such TAB method, the tape carrier 101 can be fed and positioned with high accuracy utilizing the sprocket holes 106. A large number of fine lead patterns can be formed. Batch bonding can be carried out on the inner lead portions 108 and the outer lead portions 109, respectively. Therefore, a complete automation of the packaging process of semiconductor chips can be attained.

For sealing the semiconductor chip 110 with plastics in such TAB method, there has heretofore been adopted a potting method wherein the semiconductor chip 110 is covered with a plastic coating 136 as indicated by alternate long and two short dashes line in FIGS. 6 and 7. In that potting method, however, a multi-layer structure is formed wherein the support ring 107 and the lead patterns 103 thereon are sandwiched by the upper and lower parts of the outer peripheral portion of the plastic coating 136. Thus, the upper and lower parts of the plastic coating 136 do not contact each other in that portion. As a result, problems such as easy entry of moisture or contaminants and easy separation of the plastic coating 136 have been encountered.

For that reason, in recent years, TAB method has employed a transfer molding technique, in which the semiconductor chip 110 is sealed or encapsulated by a plastic encapsulation 137 formed by a mold 120 as shown in FIG. 7. The plastic encapsulation 137 includes the base portions 109a of the outer lead portions 109. In this manner, the outer peripheral portion of the plastic encapsulation 137 becomes integral so it is possible to positively prevent entry of moisture and contaminants and also prevent separation of the plastic encapsulation 137.

However, where the outer lead portions 109 are formed at a narrow pitch, when the plastic encapsulation 137 is formed by the mold 120, a fine gap 138 is formed between adjacent outer lead portions 109 sandwiched by pressing surface 123 of an upper mold half 121 and a pressing surface 124 of a lower mold half 122 as shown in FIG. 8. When the the plastic encapsulation 137 is formed, since the pressure of molten plastics injected into concave portions 125 and 126 forming a cavity of the mold 120 is very high, the molten plastics flows out of the cavity into the fine gaps 138, resulting in oozes 139 between the outer lead portions 109 as shown in FIGS. 6 and 8. Such ooze 139 solidify to form flashes. The flashes 139 between the outer lead portions 109 are easily carbonized by heat during the subsequent outer lead bonding step and short-circuit the outer lead portions 109. Where the flashes 139 between the outer lead portions 109 are blackened, is unsightly and it's value is deteriorated. Further, the flashes 139 cause abrasion of the mold used for bending the outer lead portions 109 into the gull wing shape because the mold bites the flashes 139 together with the outer lead portions 109.

Although such outflow of molten plastics is apt to occur when the viscosity of the molten plastics is low or the injecting pressure thereof is high in transfer molding or injection molding, it is suspected that the reason why the molten plastics reaches near the front ends of the outer lead portions 109 is the capillarity in the fine gaps 138. Therefore, it is difficult to prevent the oozes 139 by simply adjusting the viscosity of molten plastics or the injecting pressure thereof.

SUMMARY OF THE INVENTION

Accordingly, it is an object of the present invention to provide a lead structure for packaging a semiconductor chip having a large number of leads capable of preventing molten plastics from flowing out a substantial distance into fine gaps between outer lead portions of the leads to form harmful oozes when the semiconductor chip is sealed or encapsulated in plastic.

The lead structure of the present invention for packaging a semiconductor chip includes a large number of electroconductive leads which are encapsulated with plastics up to a predetermined boundary when the semiconductor chip connected with the electroconductive leads is encapsulated, at least one of adjacent leads of the electroconductive leads being provided with at least one projection extending toward the other lead so that gaps formed between the electroconductive leads are meandering.

The above and other objects, features and advantages of the invention will be apparent from the following detailed description which is to be read in conjunction with the accompanying drawings.

DETAILED DESCRIPTION OF THE PREFERRED EMBODIMENTS

Figure 2:
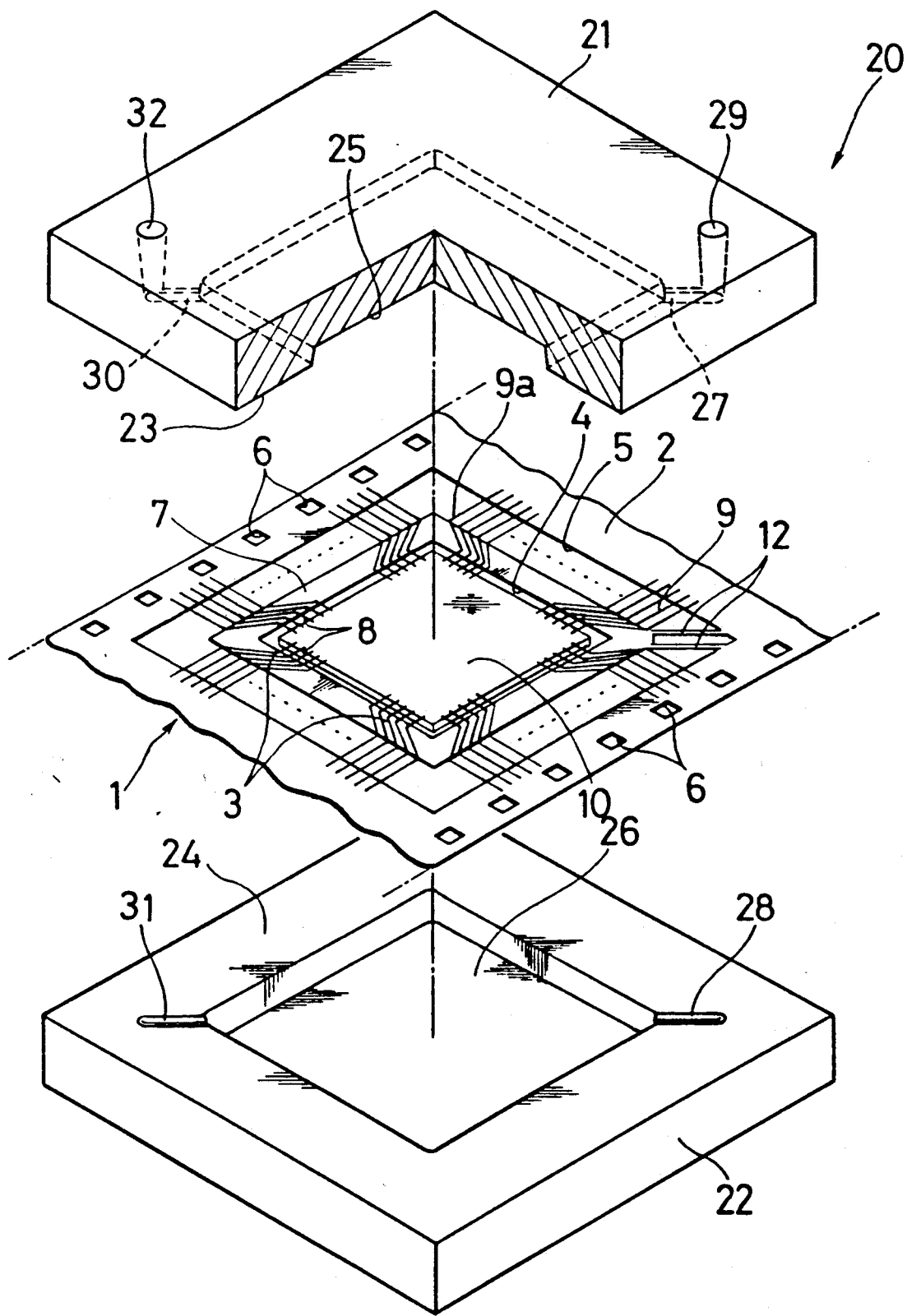
FIG. 2 is an exploded perspective view of the tape carrier of FIG. 1 and a mold for sealing it with plastic.

Referring first to FIG. 2, a tape carrier 1 comprises a film tape 2 and a large number (e.g. 200) of electroconductive lead patterns 3 formed on the film tape 2. The tape carrier 1 is provided with sprocket holes 6. The film tape 2 has a support ring 7 which defines a device aperture 4 for a semiconductor chip 10 at its center and an outer lead aperture 5 between the support ring 7 and the major part of the film tape 2 surrounding the support ring 7. Each lead pattern 3 is generally classified into an inner lead portion 8 and an outer lead portion 9. The inner lead portions 8 of the lead patterns 3 project into the device aperture 4 of the support ring 7 while the outer lead portions 9 extend over the outer lead aperture 5. The film tape 2 consists of an insulating film made of e.g. polyimide. The lead patterns 3 are formed by laminating a copper foil onto the film tape 2 and then photoetching the copper foil, for example. The semiconductor chip 10 is electrically connected to and supported by the inner lead portions 8 such that a large number of electrodes formed on the upper surface of the semiconductor chip 10 are bonded to the inner lead portions 8. The film tape 2 is provided with a pair of connections 12 at a corner of the outer lead aperture 5 so that the support ring 7 is connected to the major part of the film tape 2 through the connections 12. The connections 12 are spaced from each other by a predetermined amount. The connections 12 are formed so that they remain integral with the film tape 2 without etching and pressing when the outer lead aperture 5 is made.

Figure 1:
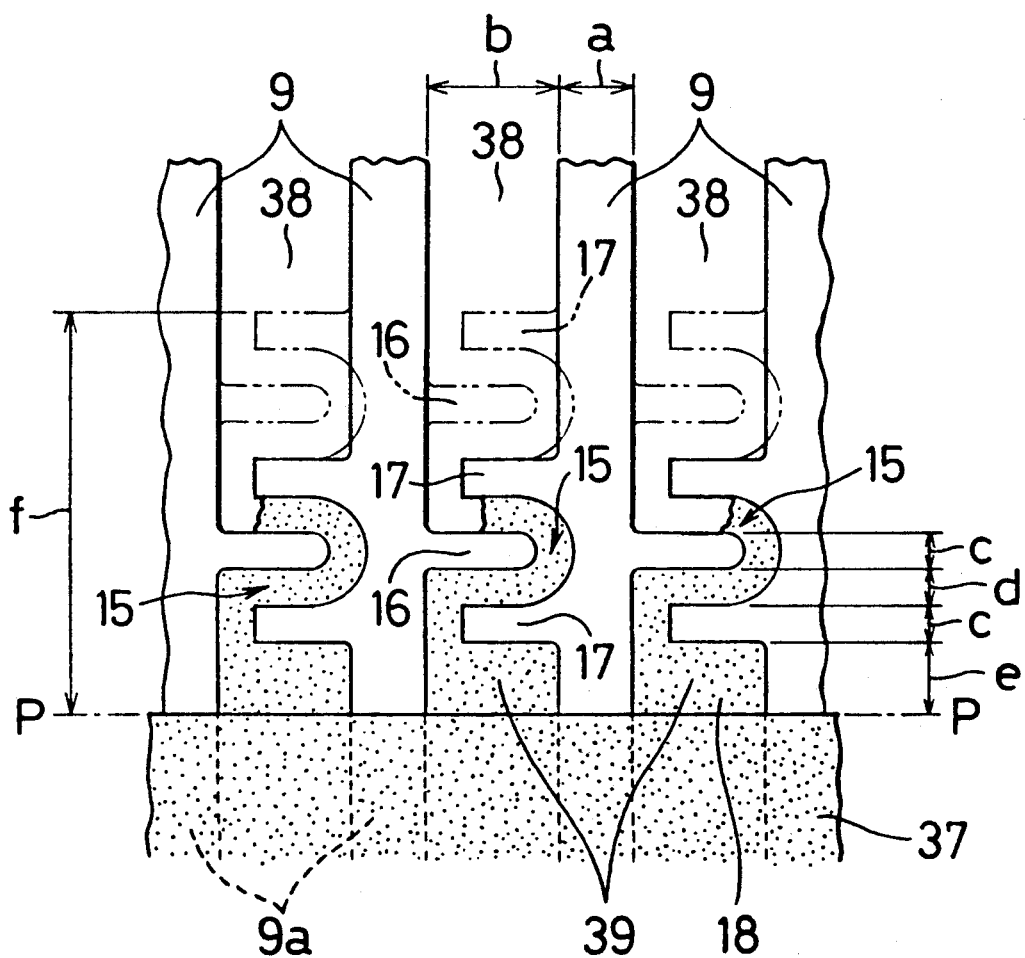
FIG. 1 is an enlarged plan view of part of a lead structure according to an embodiment of the invention which is applied to a tape carrier of TAB method.

Referring next to FIG. 1, each gap 38 between adjacent outer lead portions 9 is provided with a meandering portion 15 outside a boundary P up to which a plastic encapsulation 37 is formed as described below. The meandering portion 15 forms a kind of labyrinth. More specifically, the outer lead portions 9 adjacent to each other are provided with projections 16 and 17 extending at a right angle to the outer lead portions 9. In this embodiment, each outer lead portion 9 has one projection 16 on one side thereof and two projections 17 on the other side. The projection 16 is positioned between both projections 17 adjacent thereto so that a nearly U-shaped meandering portion 15 is formed. The inner projection 17 is spaced from the boundary P to form a sump portion 18 for molten plastics between the inner projection 17 and the boundary P. The projections 16 and 17 are formed integrally with the outer lead portions 9 when the lead patterns 3 are formed. The meandering portions 15 formed by the projections 16 and 17 are provided in all of the gaps 38 between the outer lead portions 9. In this embodiment, the width a of each outer lead portion 9 is about 100 microns and the width b of each gap 38 is about 180 microns. The width c of each of the projections 16 and 17 is about 50 microns and the spacing d of each meandering portion 15 is about 50 microns. The length e of each sump portion 18 is about 100 microns. The thickness of each outer lead portion 9 is about 37 microns.

The semiconductor chip 10 bonded to the inner lead portions 8 of the tape carrier 1 is sealed or encapsulated with plastic by a mold 20 up to the boundary P of the outer lead portions 9 as shown in FIG. 2. Although the mold 20 is designed form a number of plastic encapsulations at a time, only a part of the mold 20 is illustrated in FIG. 2. The mold 20 consists of an upper mold half 21 and a lower mold half 22. The lower surface of the upper mold half 21 and the upper surface of the lower mold half 22 function as flat pressing surfaces 23 and 24, respectively. The upper and lower mold halves 21 and 22 have nearly square-shaped concave portions 25 and 26 respectively, which form a cavity of the mold 20. Gate grooves 27 and 28 are formed in the pressing surfaces 23 and 24, respectively. The gate grooves 27 and 28 are in communication with the concave portions 25 and 26 at a corner of each of the concave portions 25 and 26. An injection hole 29 is formed in the gate groove 27. Exhaust grooves 30 and 31 are formed in the pressing surfaces 23 and 24 at the corner opposed to the the corner at which the gate grooves 27 and 28 are formed. An exhaust hole 32 is formed in the exhaust groove 30. The outer lead portions 9 are sandwiched by the pressing surfaces 23 and 24 outside the respective base portions 9a. Molten plastic such as epoxy resin and silicone resin is injected into the concave portions 25 and 26 through the injection hole 29 and the gate grooves 27 and 28. The molten plastic solidifies to form a plastic encapsulation 37 up to the boundary P of FIG. 1. Air in the concave portions 25 and 26 is exhausted through the exhaust grooves 30 and 31 and the exhaust hole 32.

When the plastic encapsulation 37 is formed, the high pressure molten plastic (e.g. 70 to 80 kg/cm$^2$) which has been injected into the concave portions 25 and 26 flows outwardly into the fine gaps 38 to form oozes 39 as shown in FIG. 1. In this example, however, each gap 38 has a meandering portion 15 formed by the projections 16 and 17. The meandering portion 15 resists the outward flow of the molten plastic and the flow path of the molten plastic is substantially elongated by the meandering portion 15. Therefore, the outwardly flowing plastic gradually loses its momentum and solidifies in the meandering portion 15. As a result, the molten plastics is prevented from flowing a substantial distance towards the end of the outer lead portion 9. In this embodiment, because the sump portion 18 formed outside the boundary P also serves to reduce the flowing-out pressure of the molten plastics, the momentum of the molten plastics is reduced much more. In the case of molten plastic which easily flows outwardly because of its low viscosity or high injecting pressure, additional projections 16 and 17 may be formed to further elongate the meandering portion 15. In that case, the distance f between the boundary P and the outermost projection 17 is about 550 microns but presents no problem when subsequently bending the outer lead portions 9 because the portion of each outer lead portion 9 which is bent to form the gull wing shape is farther out.

Figure 3:
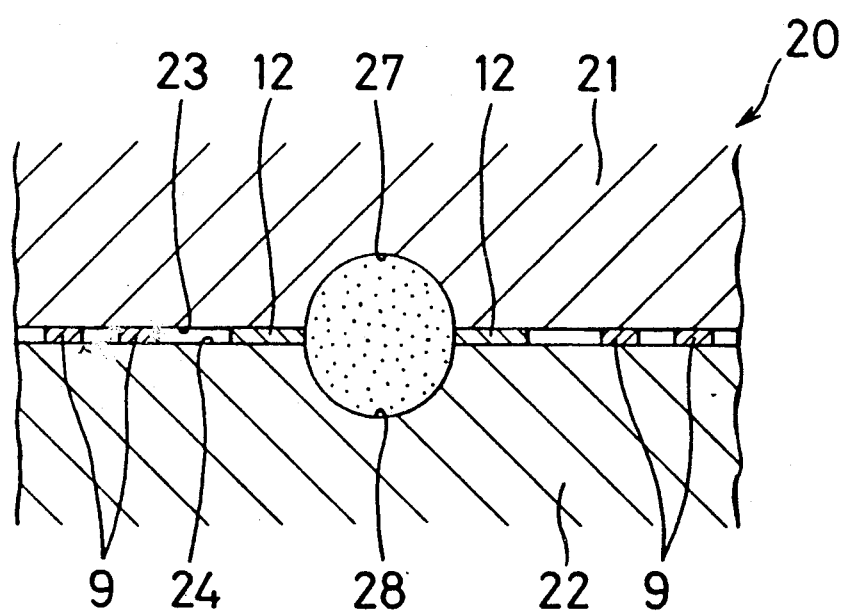
FIG. 3 is an enlarged sectional view of an injection gate for molten plastics of the mold of FIG. 2.

When the plastic encapsulation 37 is formed, the pair of connections 12 of the film tape 2 are sandwiched by the pressing surfaces 23 and 24 of the upper and lower mold halves 21 and 22 on both sides of the gate grooves 27 and 28 as shown in FIG. 3. These connections 12 prevent the molten plastics passing through the gate grooves 27 and 28 from flowing out into the gap between the pressing surfaces 23 and 24. Therefore, the molten plastics is prevented from oozing out up to the outer lead portions 9 adjacent to the gate grooves 27 and 28. Similar connections for preventing molten plastics from oozing out may be provided in the portion of the outer lead aperture 5 opposed to the exhaust grooves 30 and 31.

After the plastic encapsulation 37 is formed, the outer lead portions 9 are cut at the respective front ends to separate the plastic encapsulation 37 from the film tape 2. The outer lead portions 9 are then bonded to wiring patterns on a printed board or the like without bending the outer lead portions 9 or after the outer lead portions 9 are bent into a gull wing shape using a mold.

Figure 4:
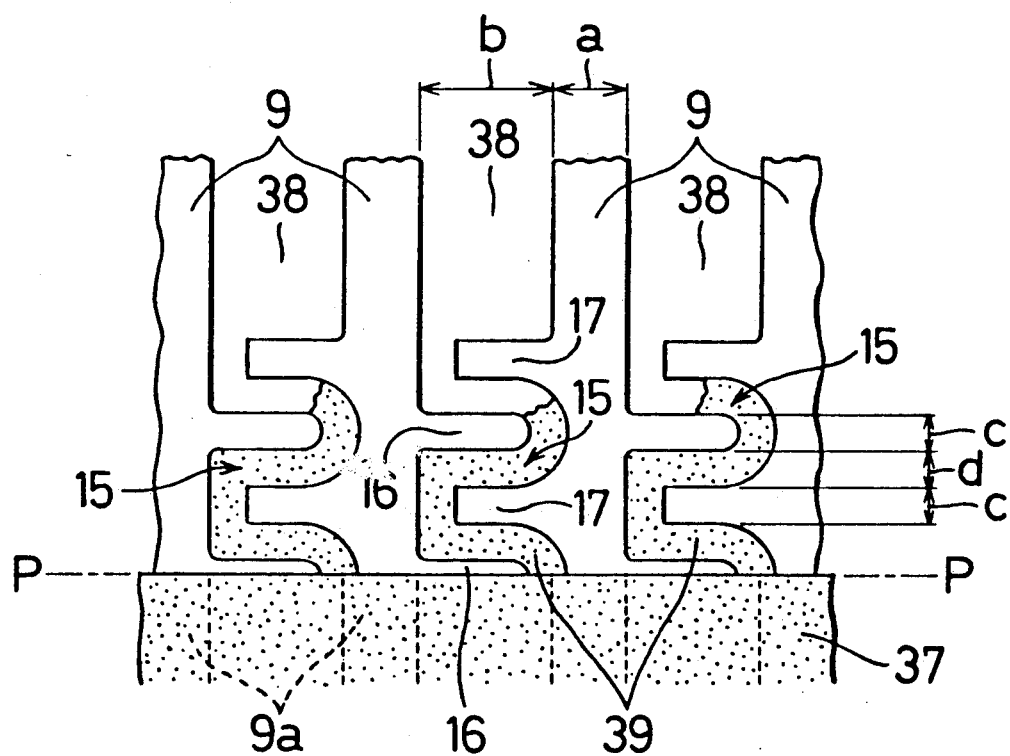
FIG. 4 is an enlarged plan view of part of a lead structure according to another embodiment of the invention.

Referring next to FIG. 4 which shows another embodiment of lead structure of the invention, an additional projection 16 is formed to each outer lead portion 9 just outside the boundary P to form a nearly S-shaped meandering portion 15 starting from adjacent the boundary P. In this embodiment, the momentum of the molten plastic is weakened by the meandering portion 15 just after the molten plastics starts to flow out.

Figure 5:
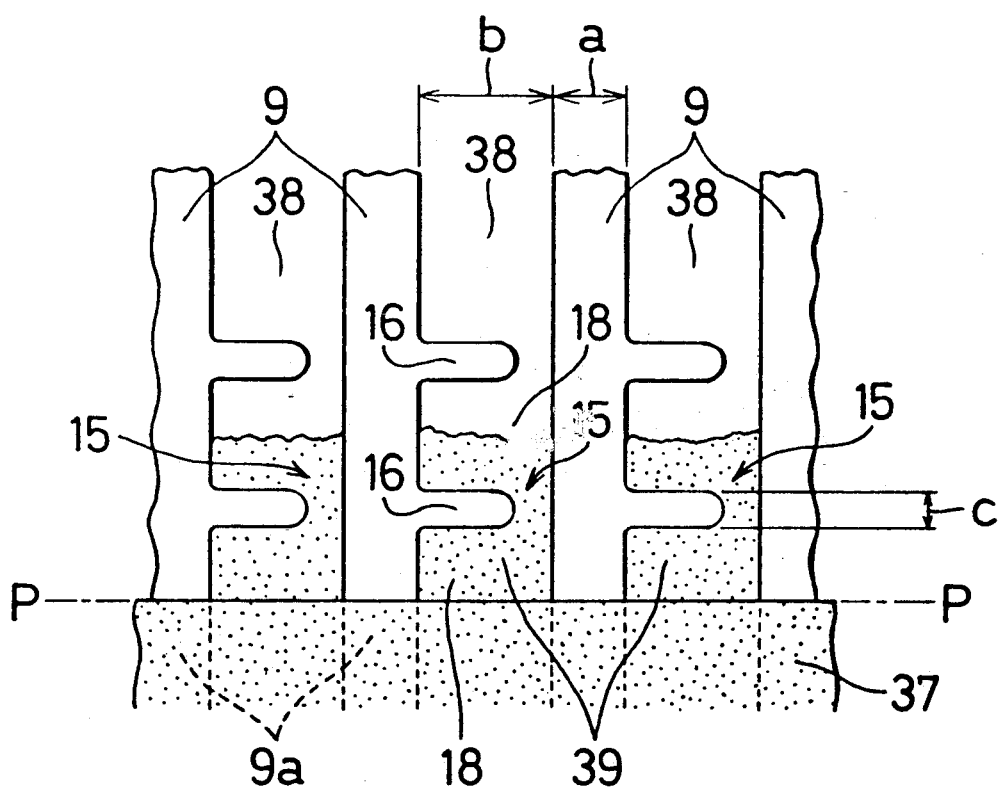
FIG. 5 is an enlarged plan view of part of a lead structure according to still another embodiment of the invention.
Figure 6:
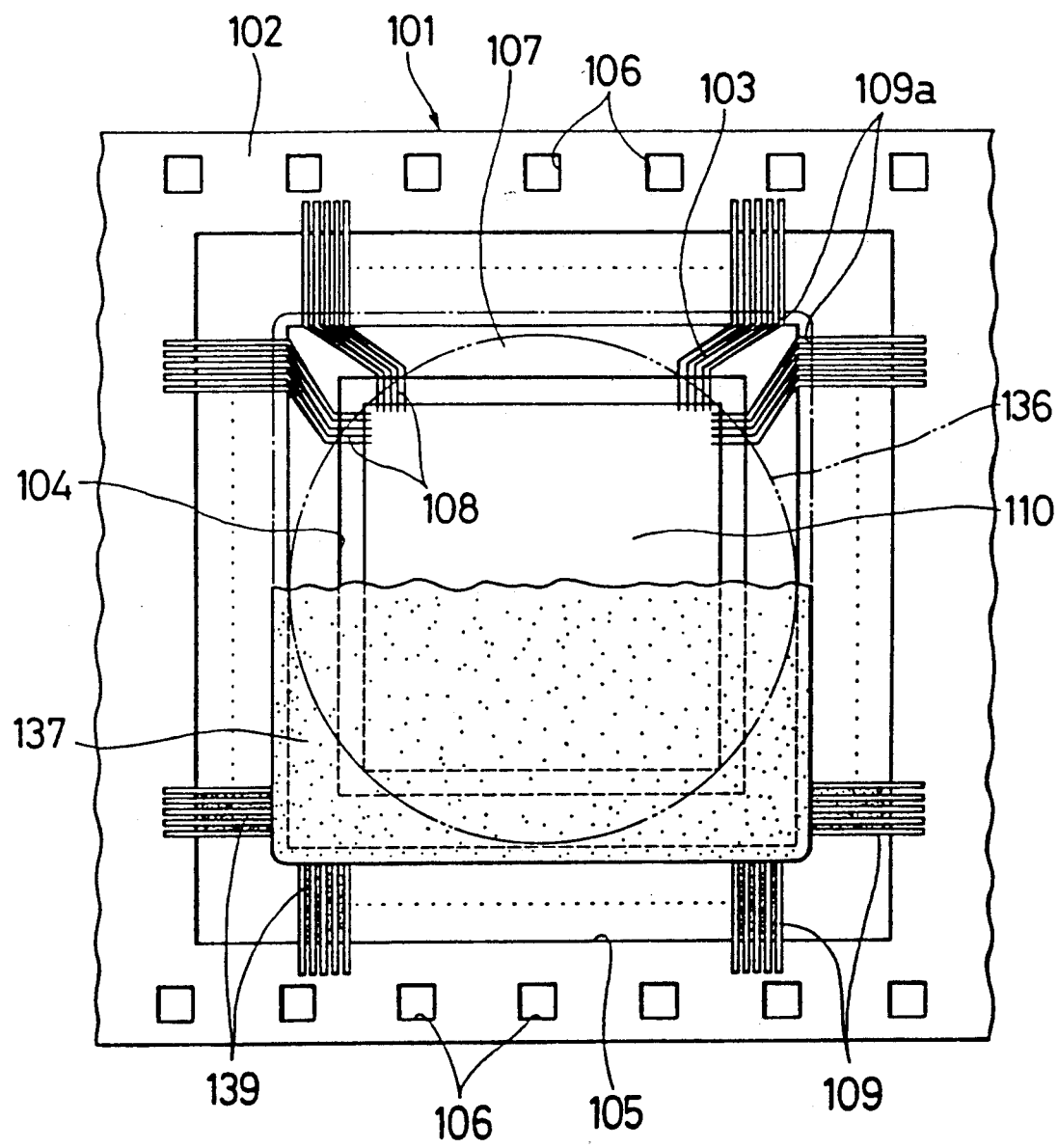
FIG. 6 is a partially cut-away plan view of a semiconductor chip supported by a tape carrier of TAB method and sealed with plastics in accordance with the prior art.
Figure 7:
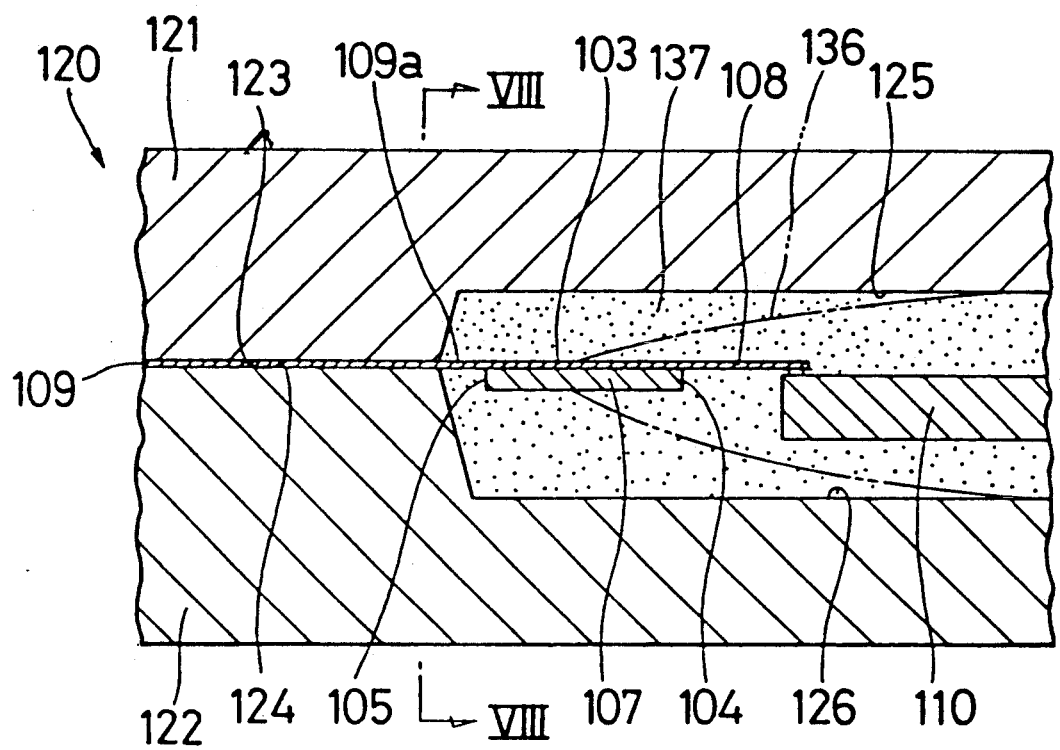
FIG. 7 is a sectional view of part of a mold which forms a plastic encapsulation for the semiconductor chip of FIG. 6.
Figure 8:
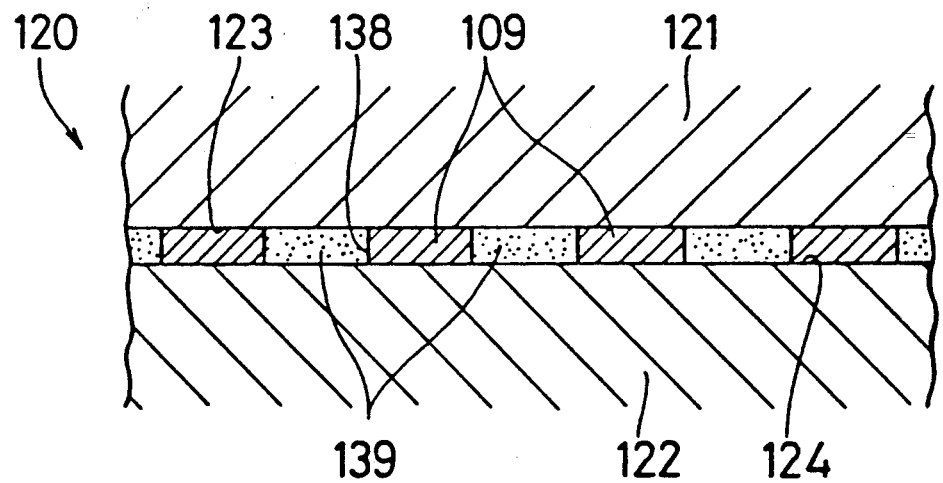
FIG. 8 is an enlarged cross section taken along line VIII—VIII of FIG. 7.

Referring next to FIG. 5 which shows still another embodiment of lead structure of the invention, two projections 16 are only formed on one side of each outer leads portion 9 to form a meandering portion 15. In this embodiment, the flowing-out pressure of molten plastic is reduced to gradually extinguish its momentum because sump portions 18 and the projections 16 are present in alternating sequence.

Although embodiments of the invention have been described, the invention is not limited to the disclosed embodiment. For example, there may be adopted various other effective shapes of the projections and the meandering portions formed by the projections than those illustrated in the above embodiments. Each meandering portion may be formed from the inside of the plastic encapsulation though it is only shown as formed outside the plastic encapsulation in the above embodiments. In that case, the plastic encapsulation is formed such that the major part of the meandering portion is outside the plastic encapsulation.

Having described illustrative embodiments of the invention with reference to the accompanying drawings, it is to be understood that the invention is not limited to such precise embodiments, and that further various changes and modifications may be effected therein by one skilled in the art without deporting from the scope and spirit of the invention as defined in the appended claims.

What is claimed is:

1. A lead structure for packaging a semiconductor chip comprising:
    a plurality of electroconductive leads adapted to be encapsulated with plastic to a predetermined outer peripheral boundary when the semiconductor chip connected to said electroconductive leads is encapsulated in plastic,
    at least one of the adjacent leads of a pair of said electroconductive leads having at least one projecting portion spaced outwardly from said outer peripheral boundary and extending towards the other lead of said pair for limiting outward flow of molten plastic by defining a tortuous path between the adjacent leads of said pair.

2. A lead structure according to claim 1, wherein each said electroconductive lead has projecting portions of the same shape.

3. A lead structure according to claim 1, wherein one said projecting portion is formed at a predetermined distance from said peripheral outer boundary for defining a sump portion for molten plastic between said projecting portion and said peripheral outer boundary.

4. A lead structure according claim 3, wherein each of said electroconductive leads has at least one said projection portion, and said sump portions are defined between an innermost projecting portion of said projecting portions and said peripheral outer boundary and between adjacent projecting portions.

5. A lead structure according to claim 1, wherein one said projecting portion is formed immediately adjacent to and outside said peripheral outer boundary.

6. A lead structure according to claim 1, wherein said electroconductive leads consist of lead patterns formed on an insulating film.

7. A lead structure for packaging a semiconductor chip, applicable to a tape carrier to Tape Automated Bonding method, comprising:
    a plurality of electroconductive leads adapted to be encapsulated with plastic to a predetermined outer peripheral boundary when the semiconductor chip connected to said electroconductive leads is encapsulated in plastic,
    at least one of the adjacent leads of a pair of said electroconductive leads having at least one projecting portion extending towards the other lead of said pair and located outside the outer peripheral boundary for limiting the outward flow of molten plastic by defining a tortuous path between adjacent leads of said pair.

8. A lead structure for packaging a semiconductor chip, comprising:
    a plurality of electroconductive leads adapted to the encapsulated with plastic to a predetermined outer peripheral boundary when the semiconductor chip connected to said electroconductive leads is encapsulated in plastic,
    each of said electroconductive leads having at least one projecting portion extending towards the other lead of said pair so as to define a tortuous path between the adjacent leads of said pair, each said projecting portion being located outside said outer peripheral boundary, said tortuous path limiting outflow of molten plastic when the semiconductor chip connected to the electroconductive leads is encapsulated in plastic.

9. A lead structure according to claim 8, when a sump portion is defined between an innermost projecting portion of said projecting portions and said outer peripheral boundary.

* * * * *